United States Patent
Park et al.

(10) Patent No.: US 7,910,920 B2
(45) Date of Patent: Mar. 22, 2011

(54) THIN FILM TRANSISTOR AND METHOD OF FORMING THE SAME

(75) Inventors: Jae-chul Park, Seoul (KR); Young-soo Park, Yongin-si (KR); Sun-Il Kim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 493 days.

(21) Appl. No.: 12/005,395

(22) Filed: Dec. 27, 2007

(65) Prior Publication Data

US 2008/0197350 A1    Aug. 21, 2008

(30) Foreign Application Priority Data

Feb. 16, 2007    (KR) .................. 10-2007-0016778

(51) Int. Cl.
*H01L 29/08* (2006.01)
*H01L 51/00* (2006.01)
*H01L 29/10* (2006.01)
*H01L 29/12* (2006.01)
*H01L 21/00* (2006.01)
*H01L 21/84* (2006.01)

(52) U.S. Cl. .............. 257/40; 257/43; 257/E21.159; 257/E21.158; 257/E21.133; 438/149; 438/166

(58) Field of Classification Search ......... 257/288, 257/E21.159, E29.255, 40, 43; 438/585, 438/761, 149, 166

See application file for complete search history.

(56) References Cited

U.S. PATENT DOCUMENTS

| | | | |
|---|---|---|---|
| 2004/0110326 A1* | 6/2004 | Forbes et al. | 438/149 |
| 2006/0043447 A1 | 3/2006 | Ishii et al. | |
| 2006/0054888 A1 | 3/2006 | Ito et al. | |
| 2006/0108636 A1 | 5/2006 | Sano et al. | |
| 2006/0113536 A1 | 6/2006 | Kumomi et al. | |
| 2006/0113539 A1* | 6/2006 | Sano et al. | 257/59 |
| 2006/0145157 A1 | 7/2006 | Choi et al. | |
| 2006/0284172 A1 | 12/2006 | Ishii | |
| 2008/0296568 A1* | 12/2008 | Ryu et al. | 438/104 |

FOREIGN PATENT DOCUMENTS

| | | |
|---|---|---|
| CN | 1659711 A | 8/2005 |
| CN | 1797159 A | 7/2006 |
| JP | 2006-186119 | 7/2006 |
| JP | 2006-269469 | 10/2006 |
| JP | 2007-073563 | 3/2007 |

OTHER PUBLICATIONS

Chinese Office Action dated Jul. 2, 2010 in corresponding Chinese Application No. 200810074302.8, with English translation.

* cited by examiner

*Primary Examiner* — Walter L Lindsay, Jr.
(74) *Attorney, Agent, or Firm* — Harness, Dickey & Pierce, P.L.C.

(57) ABSTRACT

A thin film transistor (TFT) may include a channel layer, a source electrode, a drain electrode, a protective layer, a gate electrode, and/or a gate insulating layer. The channel layer may include an oxide semiconductor material. The source electrode and the drain electrode may face each other on the channel layer. The protective layer may be under the source electrode and the drain electrode and/or may cover the channel layer. The gate electrode may be configured to apply an electric field to the channel layer. The gate insulating layer may be interposed between the gate electrode and the channel layer.

36 Claims, 8 Drawing Sheets

THIN FILM TRANSISTOR AND METHOD OF FORMING THE SAME

PRIORITY STATEMENT

This application claims the benefit of priority to Korean Patent Application No. 10-2007-0016778, filed on Feb. 16, 2007, in the Korean Intellectual Property Office, the entire contents of which are incorporated herein in their entirety by reference.

BACKGROUND

1. Field

Example embodiments relate to a semiconductor device and/or a method of manufacturing the same, and for example, to a thin film transistor and/or a method of manufacturing the same.

2. Description of Related Art

Thin film transistors (TFTs) are used as switching devices in flat panel display apparatuses, for example, a liquid crystal display apparatus or an organic light emitting display apparatus. The mobility or leakage current of the TFTs is greatly affected by the material and the state of a channel layer of the TFT.

In commercially produced liquid crystal display apparatuses, the channel layer of the TFT is mainly an amorphous silicon layer which has a charge mobility of approximately 0.5 cm$^2$/Vs, which is relatively very low. Therefore, increasing the operation speed of the commercially produced liquid crystal display apparatuses is more difficult.

Accordingly, research has been conducted on using an oxide semiconductor material layer as the channel layer of the TFT, for example, a ZnO based material layer, having a charge mobility higher than that of the amorphous silicon layer. A Ga—In—Zn—O layer, which is one of the ZnO based material layers, has a charge mobility tens of times greater than the amorphous silicon layer. Therefore, TFTs that use the Ga—In—Zn—O layer as the channel layer are expected to be the next generation driving devices of display apparatuses.

However, if the ZnO based material layer is employed as the channel layer of a TFT, the channel may be damaged after the channel layer is formed, and as a result, the electrical characteristics of a device may degrade.

SUMMARY

Example embodiments provide a thin film transistor (TFT) including a channel layer having a charge mobility higher than an amorphous silicon layer, and/or degradation of the characteristics of the channel layer due to plasma may be reduced.

Example embodiments provide a method of manufacturing the TFT.

According to an example embodiment, a thin film transistor may include a channel layer, a source electrode, a drain electrode, a protective layer, a gate electrode, and/or a gate insulating layer. The channel layer may include an oxide semiconductor material. The source electrode and the drain electrode may face each other on the channel layer. The protective layer may be under the source electrode and a drain electrode and/or may cover the channel layer. The gate electrode may be configured to apply an electric field to the channel layer. The gate insulating layer may be interposed between the gate electrode and the channel layer.

According to an example embodiment, the channel layer may be a ZnO based material layer.

According to an example embodiment, the channel layer may be an a(In$_2$O$_3$).b(Ga$_2$O$_3$).c(ZnO) layer, where a, b, and c are real numbers such that a≧0, b≧0, and c>0.

According to an example embodiment, the channel layer may be an a(In$_2$O$_3$).b(Ga$_2$O$_3$).c(ZnO) layer, where a, b, and c are real numbers such that a≧1, b≧1, and 0<c≦1.

According to an example embodiment, the protective layer may provide contact regions, and the channel layer may contact the source electrode and drain electrode at the contact regions.

According to an example embodiment, the protective layer may be at least one of one of a silicon oxide layer and a silicon nitride layer.

According to an example embodiment, the thin film transistor may include ohmic contact layers between the channel layer and the source electrode and between the channel layer and the drain electrode.

According to an example embodiment, the gate electrode may be above the channel layer.

According to an example embodiment, the gate electrode may be below the channel layer.

According to an example embodiment, a method of manufacturing a thin film transistor may include forming a channel layer including an oxide semiconductor material and a protective layer covering the channel layer. A source electrode and a drain electrode may be formed facing each other and/or contacting two regions of the channel layer. A gate insulating layer may be formed covering the protective layer, the source electrode, and/or the drain electrode. The gate electrode may be formed on the gate insulating layer above the channel layer.

According to an example embodiment, the channel layer may be a ZnO based material layer.

According to an example embodiment, the protective layer may provide contact regions, and/or the channel layer may contact the source electrode and the drain electrode at the contact regions.

According to an example embodiment, the forming of the channel layer and the protective layer may include depositing an oxide semiconductor material film on a substrate, forming the channel layer by patterning the oxide semiconductor material film, depositing a protective material film on the substrate and the channel layer, and/or forming the protective layer by patterning the protective material film.

According to an example embodiment, the forming of the channel layer and the protective layer may include depositing an oxide semiconductor material film on a substrate, depositing a protective material film on the oxide semiconductor material film, and/or patterning the oxide semiconductor material film and the protective material film.

According to an example embodiment, the protective material film may be patterned to a shape that provides contact regions, and/or the channel layer may contact the source electrode and the drain electrode at the contact regions.

According to an example embodiment, a method of manufacturing a thin film transistor may include forming a gate electrode. A gate insulating layer may be formed covering the gate electrode. A channel layer including an oxide semiconductor material may be formed on the gate insulating layer above the gate electrode and a protective layer may be formed covering the channel layer. A source electrode and a drain electrode may be formed facing each other and contacting two regions of the channel layer.

According to an example embodiment, the channel layer may be a ZnO based material layer.

According to an example embodiment, the protective layer may provide contact regions, and/or the channel layer may contact the source electrode and the drain electrode at the contact regions.

According to an example embodiment, the forming of the channel layer and the protective layer may include depositing an oxide semiconductor material film on the gate insulating layer, forming the channel layer by patterning the oxide semiconductor material film, depositing a protective material film on the gate insulating layer and the channel layer, and/or forming the protective layer by patterning the protective material film.

According to an example embodiment, the forming of the channel layer and the protective layer may include depositing an oxide semiconductor material film on the gate insulating layer, depositing a protective material film on the oxide semiconductor material film, and/or patterning the oxide semiconductor material film and the protective material film.

According to an example embodiment, the protective material film may be patterned to a shape that provides contact regions, and/or the channel layer may contact the source electrode and the drain electrode at the contact regions.

According to an example embodiment, the patterning of the oxide semiconductor material film and the protective material film may be performed using one halftone photomask or a slit photomask.

According to an example embodiment, the method of may include treating the surface of the channel layer using oxygen plasma after the forming of the channel layer and before the forming of the protective material film.

According to an example embodiment, the method may include wet washing the surface of the channel layer using a washing solution after the forming of the channel layer and before the forming of the protective material film.

According to an example embodiment, the method may include treating the surface of the oxide semiconductor material film using oxygen plasma after the depositing of the oxide semiconductor material film and before the depositing of the protective material film.

According to an example embodiment, the method may include wet washing the surface of the oxide semiconductor material film using a washing solution after the depositing of the oxide semiconductor material film and before the depositing of the protective material film.

According to an example embodiment, the washing solution for wet washing may be isopropyl alcohol (IPA) and deionized water or acetone, IPA, and deionized water.

According to an example embodiment, the method may include forming ohmic contact layers between the channel layer and the source electrode and between the channel layer and the drain electrode.

According to an example embodiment, the ohmic contact layers may be formed of a conductive oxide having an oxygen content that is less than an oxygen content of the channel layer.

According to an example embodiment, a TFT may have higher charge mobility.

BRIEF DESCRIPTION OF THE DRAWINGS

The above and/or other aspects and advantages will become more apparent and more readily appreciated from the following detailed description of example embodiments taken in conjunction with the accompanying drawings of which.

DETAILED DESCRIPTION OF EXAMPLE EMBODIMENTS

Example embodiments will now be described more fully hereinafter with reference to the accompanying drawings. Embodiments may, however, be in many different forms and should not be construed as being limited to the example embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when a component is referred to as being "on," "connected to" or "coupled to" another component, it can be directly on, connected to or coupled to the other component or intervening components may be present. In contrast, when a component is referred to as being "directly on," "directly connected to" or "directly coupled to" another component, there are no intervening components present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one component or feature's relationship to another component(s) or feature(s) as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Reference will now be made to example embodiments, which are illustrated in the accompanying drawings, wherein like reference numerals refer to the like components throughout.

Figure 1A:
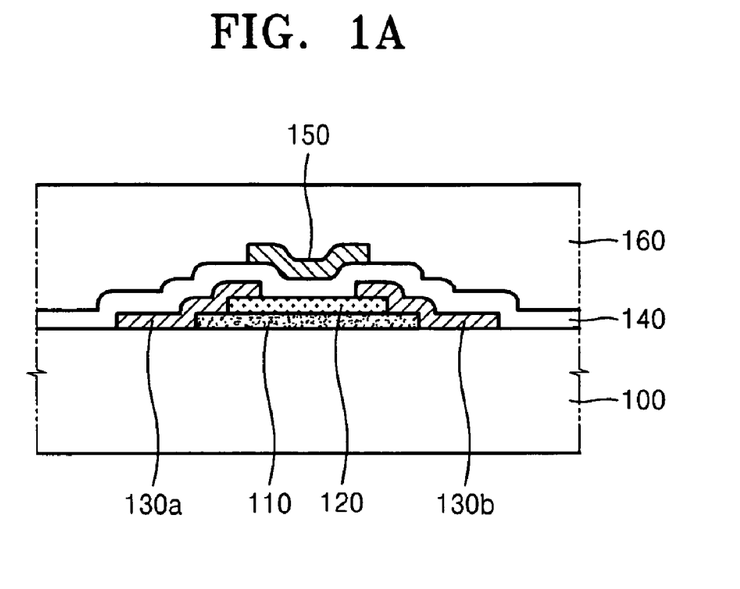
FIGS. 1A and 1B are a cross-sectional view and a plan view, respectively, illustrating a thin film transistor (TFT) according to an example embodiment.
Figure 1B:
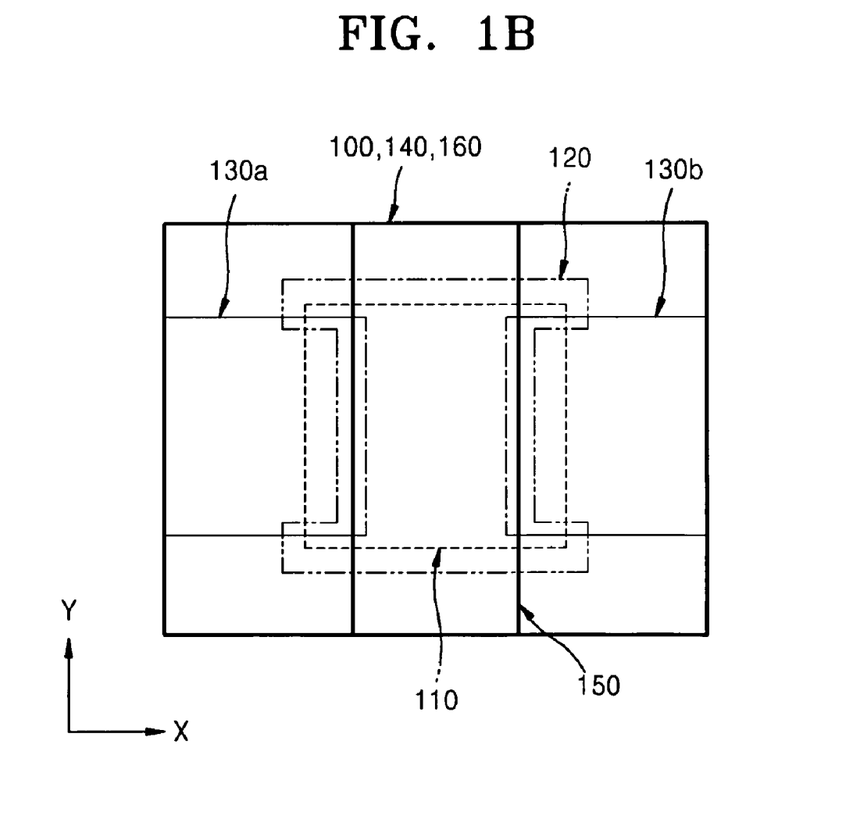

FIGS. 1A and 1B are a cross-sectional view and a plan view, respectively, illustrating a thin film transistor (TFT) according to an example embodiment.

The TFT according to an example embodiment may have a top gate structure in which a gate electrode 150 is formed above a channel layer 110.

Referring to FIGS. 1A and 1B, the channel layer 110 may be formed on a substrate 100. The substrate 100 may be one of a silicon substrate, a glass substrate, and a plastic substrate, and/or may be a transparent or an opaque substrate. The channel layer 110 may be an oxide semiconductor material layer, for example, a ZnO based material layer. The ZnO based material layer may be, for example, a Ga—In—Zn—O layer. The Ga—In—Zn—O layer of the channel layer 110 may be an $a(In_2O_3).b(Ga_2O_3).c(ZnO)$ layer such that a, b, and c are real numbers and $a \geq 0$, $b \geq 0$, and $c > 0$. For example, a, b, and c, may be real numbers such that $a \geq 1$, $b \geq 1$, and $0 < c \leq 1$. The Ga—In—Zn—O layer of the channel layer 110 may be formed by a physical vapor deposition (PVD) method, e.g., a sputtering method or an evaporation method.

A source electrode 130a and a drain electrode 130b, which face each other, may be formed on both ends of the channel layer 110. The source electrode 130a and the drain electrode 130b may extend on the substrate 100 around the channel layer 110. The source electrode 130a and the drain electrode 130b may be metal layers and/or may be one of, for example, a Mo single layer, a multi-metal layer including a Mo layer, a metal layer including Ti, and a metal layer including Cr.

A protective layer 120 may be formed on the channel layer 110. The protective layer 120 may cover a portion of the channel layer 110 that does not contact the source electrode 130a and the drain electrode 130b, respectively. Portions of the protective layer 120 may extend on the substrate 100 around the channel layer 110. The source electrode 130a and the drain electrode 130b may extend on the protective layer 120. The protective layer 120 may include a first contact region where the channel layer 110 and the source electrode 130a contact and a second contact region where the channel layer 110 and the drain electrode 130b contact. The first and second contact regions may be both ends of an upper surface of the channel layer 110. Accordingly, the protective layer 120 may be formed to cover a region of the upper surface of the channel layer 110 except for the first and second contact regions on both ends of the upper surface of the channel layer 110. Accordingly, as depicted in FIG. 1B, the protective layer 120 may have a dumbbell shape. Because of the dumbbell shape of the protective layer 120, central areas of both ends of the channel layer 110 may be exposed. However, the shape of the protective layer 120 is not limited to the dumbbell shape, and the shape of the protective layer may be modified to various shapes, e.g., the shape of the protective layer may be modified to various shapes which may expose central areas of both ends of the channel layer 110. For example, the protective layer 120 may have a rectangular shape that crosses the channel layer 110 in a Y axis direction. As depicted in FIG. 1B, a portion of the protective layer 120 may extend outside the channel layer 110 or may not extend outside the channel layer 110. The upper surface of the channel layer 110 may be covered by the protective layer 120, the source electrode 130a, and/or the drain electrode 130b.

A gate insulating layer 140, which covers the channel layer 110, the protective layer 120, the source electrode 130a, and/or the drain electrode 130b, may be formed on the substrate 100. The gate insulating layer 140 may be a silicon oxide layer or a silicon nitride layer. The gate electrode 150 may be formed on the gate insulating layer 140 above the channel layer 110. The gate electrode 150 may be formed of a same material as the source electrode 130a, or may be formed of a different material than the source electrode 130a. A passivation layer 160, which covers the gate electrode 150, may be formed on the gate insulating layer 140. The passivation layer 160 may be a silicon oxide layer or a silicon nitride layer.

The channel layer 110, the source electrode 130a, the drain electrode 130b, the gate insulating layer 140, and the gate electrode 150 may have thicknesses of approximately 30 to 200 nm, 10 to 200 nm, 10 to 200 nm, 100 to 300 nm, and 100 to 300 nm, respectively.

Although not shown, ohmic contact layers may be included between the channel layer 110 and the source electrode 130a, and/or between the channel layer 110 and the drain electrode 130b. The ohmic contact layers may be conductive oxide layers having an oxygen content that is less than that of the channel layer 110. The ohmic contact layers may reduce a contact resistance between the channel layer 110 and the source electrode 130a and between the channel layer 110 and the drain electrode 130b, and/or reduce the leakage of holes to the outside of the channel layer 110.

Figure 2A:
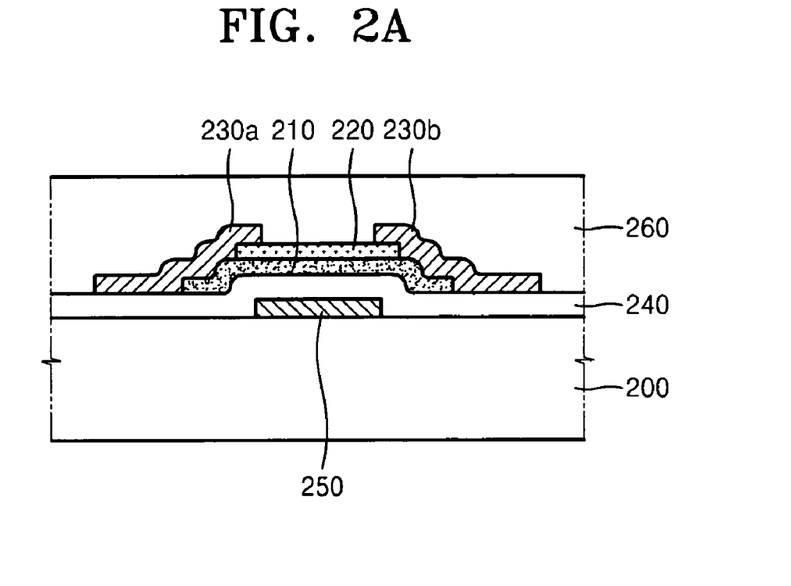
FIGS. 2A and 2B are a cross-sectional view and a plan view, respectively, illustrating a TFT according to another example embodiment.
Figure 2B:
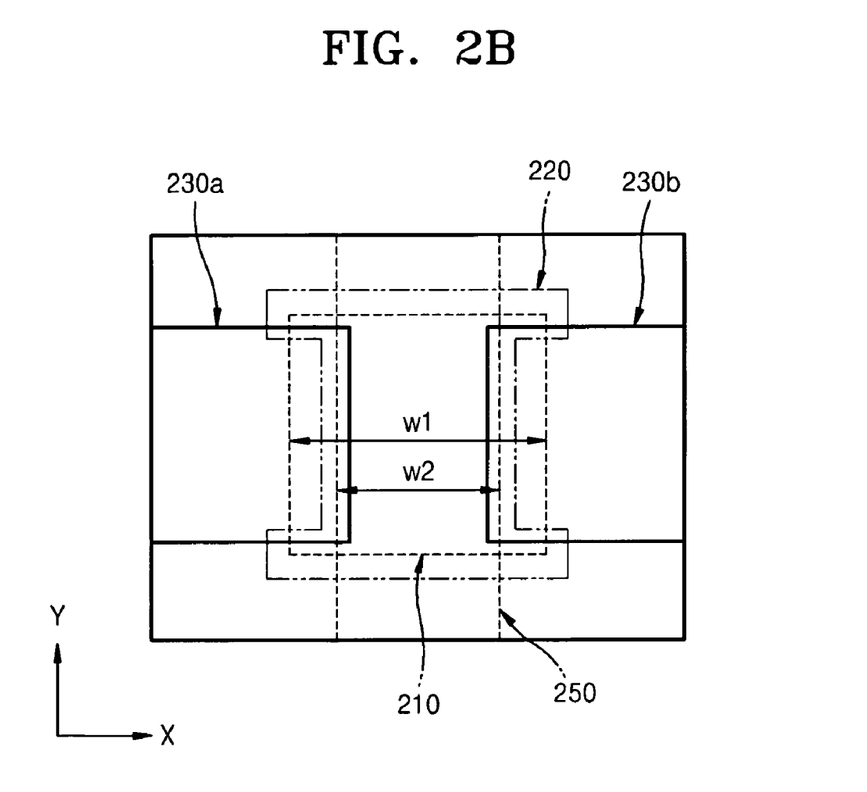

FIGS. 2A and 2B are a cross-sectional view and a plan view, respectively, illustrating a TFT according to another example embodiment. The TFT according to an another example embodiment may have a bottom gate structure in which a gate electrode 250 is formed under a channel layer 210.

Referring to FIGS. 2A and 2B, the gate electrode 250 may be formed on a substrate 200, and a gate insulating layer 240, which covers the gate electrode 250, may be formed on the substrate 200. The channel layer 210 may be formed on the gate insulating layer 240 above the gate electrode 250. A width w1 of the channel layer 210 in an X direction may be greater than a width w2 of the gate electrode 250 in the X direction. A protective layer 220, which covers a majority portion of the channel layer 210 except for minority portions of the channel layer 210, may be formed on the channel layer 210. As shown in FIG. 2B, the protective layer 220 may be formed in a dumbbell shape in order to expose central portions of both ends of the channel layer 210, however, example embodiments are not limited thereto, and the protective layer 220 may have various shapes, e.g., the protective layer may have various shapes which expose central portions on both ends of the channel layer 210. Portions of the protective layer 220 may extend on the gate insulating layer 240 outside the channel layer 210. A source electrode 230a and a drain electrode 230b may be formed to contact the central portions of both ends of the channel layer 210. Portions of the source electrode 230a and the drain electrode 230b may extend on both ends of the protective layer 220. An upper surface of the channel layer 210 may be covered by the protective layer 220, the source electrode 230a, and/or the drain electrode 230b. A passivation layer 260, which covers the channel layer 210, the protective layer 220, the source electrode 230a, and/or the drain electrode 230b, may be formed on the gate insulating layer 240.

The materials and thicknesses of the substrate 200, the channel layer 210, the protective layer 220, the source electrode 230a, the drain electrode 230b, the gate insulating layer 240, the gate electrode 250, and/or the passivation layer 260 of the TFT of FIGS. 2A and 2B may be identical to those of the substrate 100, the channel layer 110, the protective layer 120, the source electrode 130a, the drain electrode 130b, the gate insulating layer 140, the gate electrode 150, and/or the passivation layer 160, respectively, of the TFT of FIGS. 1A and 1B.

Although not shown, ohmic contact layers may be included between the channel layer 210 and the source electrode 230a, and between the channel layer 210 and the drain electrode 230b. The ohmic contact layers may be conductive oxide layers having an oxygen content lower than that of the channel layer 210.

FIGS. 3A through 3E are cross-sectional views illustrating a method of manufacturing the TFT of FIGS. 1A and 1B, according to an example embodiment. The TFT may have a top gate structure and like reference numerals are used to indicate substantially identical elements in FIGS. 1A and 1B.

Figure 3A:
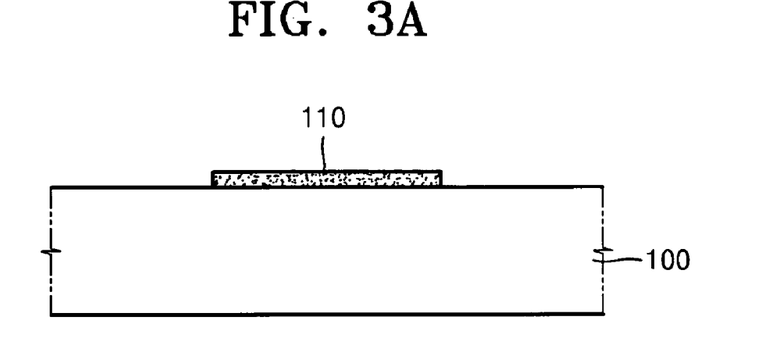
FIGS. 3A through 3E are cross-sectional views illustrating a method of manufacturing the TFT of FIGS. 1A and 1B, according to an example embodiment.

Referring to FIG. 3A, the channel layer 110 may be formed on the substrate 100. The channel layer 110 may be formed of an oxide semiconductor, e.g., Ga—In—Zn—O, using a PVD method including a sputtering method or an evaporation method. At least one target may be used to form the channel layer 110 using the PVD method. The at least one target may include at least one compound selected from a group including $In_2O_3$, $Ga_2O_3$, and ZnO. After the channel layer 110 is formed, the surface of the channel layer 110 may be treated with oxygen plasma. The oxygen plasma treatment may increase the oxygen content in the surface of the channel layer 110, which in turn may increase the electrical resistance at the surface of the channel layer 110. If the electrical resistance at the surface of the channel layer 110 is increased, a characteristic degradation at the surface of the channel layer 110 may be reduced in a subsequent process. After the oxygen plasma treatment of the channel layer 110 is completed, a wet washing process may be performed in order to remove etch by-products which may be present on an upper surface of the substrate 100 and the channel layer 110. A wet washing solution of the wet washing process may be at least one selected from a group including isopropyl alcohol (IPA), deionized water, and acetone.

Figure 3B:
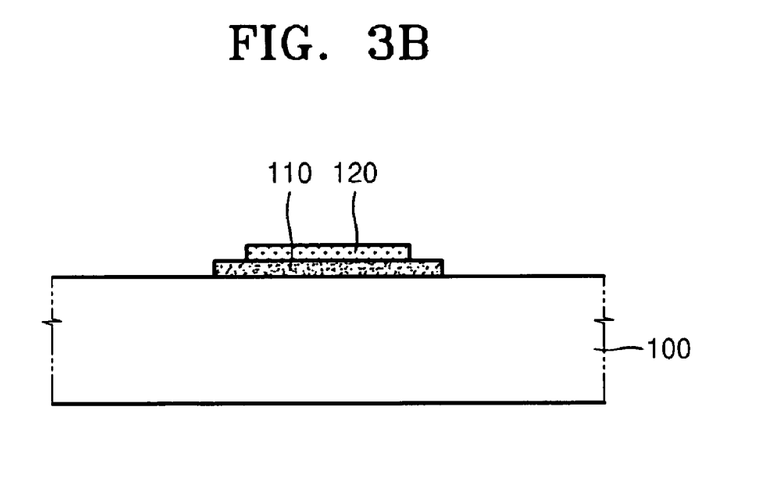

Referring to FIG. 3B, the protective layer 120 may be formed to cover a region of the channel layer 110, except for the first and second regions facing each other on both ends of the upper surface of the channel layer 110. The protective layer 120 may be formed to extend on the substrate 100. The protective layer 120 may be formed by patterning a protective material film (not shown) formed on the substrate 100 so that a region of the channel layer 110 may be exposed except for the two regions of the channel layer 110 facing each other, for example, both ends of the upper surface of the channel layer 110. The protective layer 120 may be a silicon oxide layer or a silicon nitride layer formed using a chemical vapour deposition (CVD) method or a PVD method.

Figure 3C:
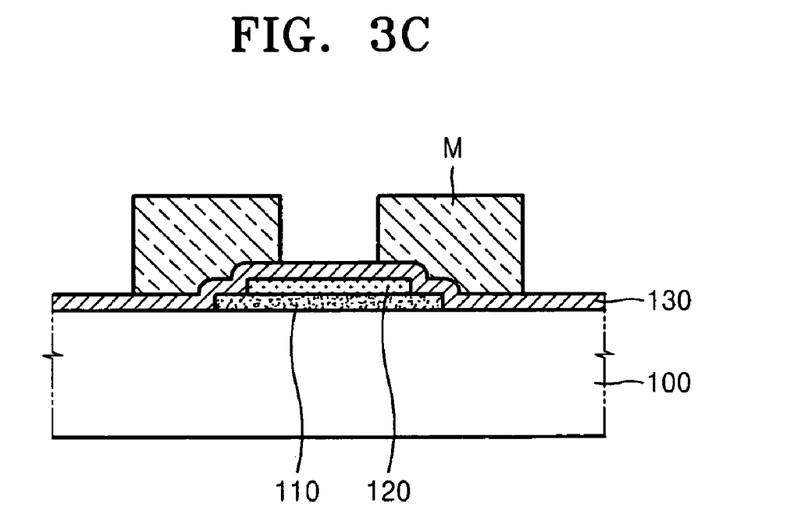
Figure 3D:
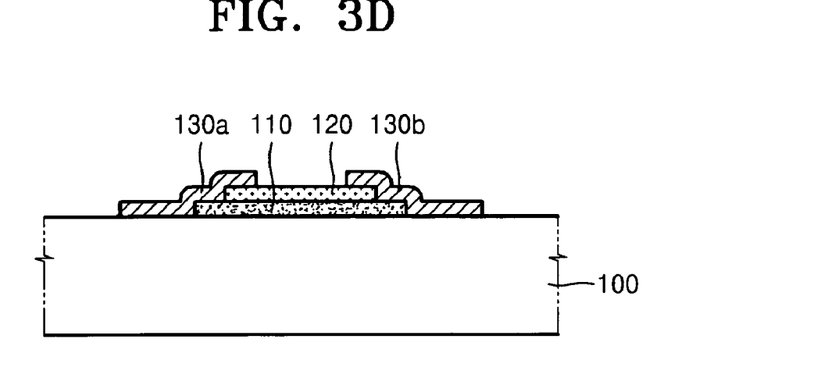

Referring to FIG. 3C, a metal layer 130, which covers the channel layer 110 and the protective layer 120, may be formed on the substrate 100. A mask M, which defines source and drain regions, may be formed on the metal layer 130. The metal layer 130 not covered by the mask M may be removed using a wet or dry etching method. The mask M may be removed. Accordingly, as depicted in FIG. 3D, the source electrode 130a and the drain electrode 130b may be formed contacting both ends of the channel layer 110. The metal layer 130 may be one of a Mo single layer, a multi-metal layer including a Mo layer, a metal layer including Ti, or a metal layer including Cr. The metal layer 130 may be formed using a PVD method. If the metal layer 130 is wet etched, an etchant may be a mixture of phosphoric acid $H_3PO_4$, acetic acid $CH_3COOH$, nitric acid $HNO_3$ and/or deionized water.

The characteristic degradation and damage to the channel layer 110 may be reduced if performing an etching process for forming the source electrode 130a and the drain electrode 130b because the protective layer 120 is formed on the channel layer 110. For example, if the metal layer 130 is etched using a wet etching method in order to form the source electrode 130a and the drain electrode 130b, the patterning of the metal layer 130 may be possible even if there is no etch selectivity between the metal layer 130 and the channel layer 110. If the metal layer 130 is etched using a dry etching method in order to form the source electrode 130a and the drain electrode 130b, the characteristic degradation of the channel layer 110 due to plasma used for dry etching may be reduced.

If the source electrode 130a and the drain electrode 130b are formed at a higher temperature, in a process of forming the source electrode 130a and the drain electrode 130b, an ohmic contact layer (not shown) having an oxygen content less than an oxygen content of the channel layer 110 may be formed between the channel layer 110 and the source electrode 130a and between the channel layer 110 and the drain electrode 130b. If the ohmic contact layer is not formed in the process of forming the source electrode 130a and the drain electrode 130b, an annealing process may be subsequently performed. Due to the annealing process, a reaction may occur between the channel layer 110 and the source electrode 130a and between the channel layer 110 and the drain electrode 130b, and as a result, the ohmic contact layer may be formed. The annealing process may be a furnace annealing or a rapid thermal annealing (RTA) process, and/or may be performed at a temperature of about 200 to 400° C. from about 10 minutes to 2 hours under an oxygen or nitrogen atmosphere.

The ohmic contact layer (not shown) may be formed at a different time and/or in a different method from the method of forming the source electrode 130a and the drain electrode 130b. For example, prior to forming the metal layer 130, an ohmic contact material layer (not shown), which covers the channel layer 110 and the protective layer 120, may be formed on the substrate 100. The ohmic contact material layer may be a Ga—In—Zn—O layer having an oxygen content that is less than an oxygen content of the channel layer 110, and/or may be formed by a PVD method without using oxygen gas. The ohmic contact material layer may be patterned identical to the shape of the source and drain electrodes 130a and 130b.

Figure 3E:
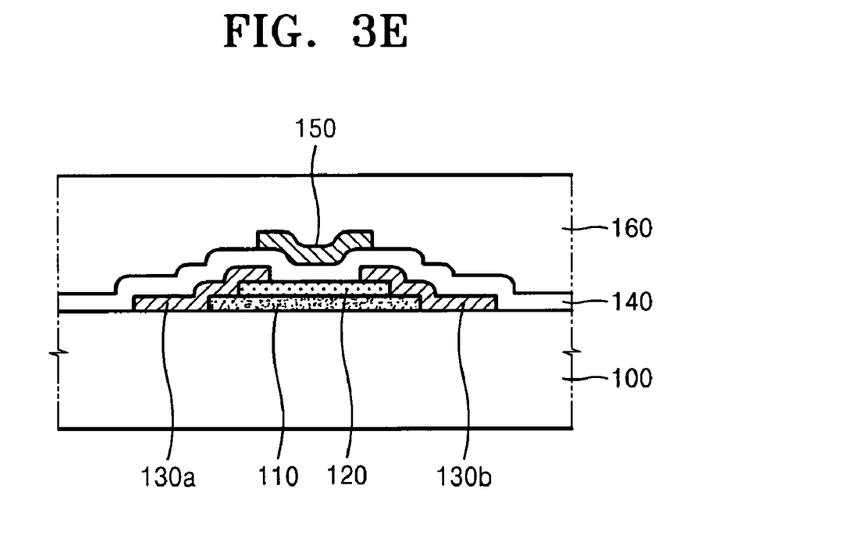

Referring to FIG. 3E, the gate insulating layer 140, which covers the protective layer 120, the source electrode 130a, and/or the drain electrode 130b, may be formed on the substrate 100. The gate insulating layer may be formed by a plasma enhanced chemical vapor deposition (PECVD) method. The gate insulating layer 140 may be formed of a silicon oxide layer or a silicon nitride layer. The gate electrode 150 may be formed on the gate insulating layer 140 such that the gate electrode 150 is located above the channel layer 110. The gate electrode 150 may be formed of a same or a different material for forming the source electrode 130a and the drain electrode 130*b*. The passivation layer 160, which covers the gate electrode 150, may be formed on the gate insulating layer 140. The passivation layer 160 may be formed of a silicon oxide layer or a silicon nitride layer.

FIGS. 4A through 4F are cross-sectional views illustrating a method of manufacturing the TFT of FIGS. 1A and 1B, with a different method of forming the channel layer 110 and the protective layer 120 of the TFT, according to another example embodiment.

In the method of forming the TFT of FIGS. 3A through 3E, according to an example embodiment, the channel layer 110 and the protective layer 120 may be formed using different photomasks. However, in the method of forming the TFT of FIGS. 4A through 4F, the channel layer 110 and the protective layer 120 may be formed using one photomask, for example, a halftone photomask or a slit photomask.

Figure 4A:
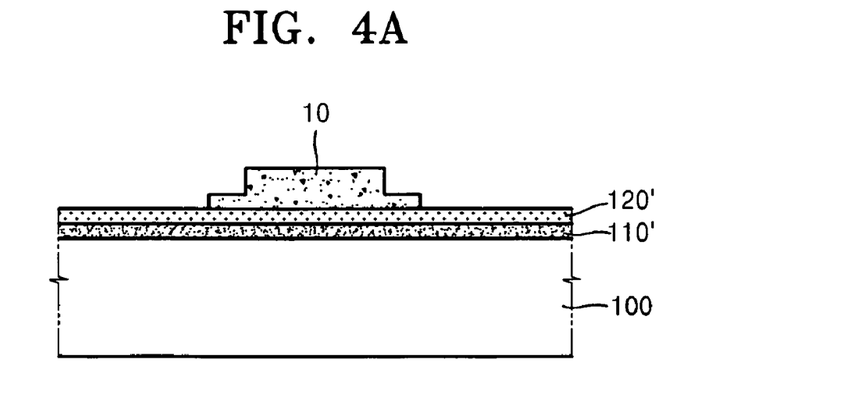
FIGS. 4A through 4F are cross-sectional views illustrating a method of manufacturing the TFT of FIGS. 1A and 1B, with a different method of forming a channel layer and a protective layer of the TFT, according to another example embodiment.

Referring to FIG. 4A, an oxide semiconductor film 110' may be formed on the substrate 100. A protective material film 120' may be formed on the oxide semiconductor film 110'. The oxide semiconductor film 110' and the protective material film 120' may be continuously deposited using a PVD method. Alternatively, after the oxide semiconductor film 110' is formed using the PVD method, the protective material film 120' may be formed using a CVD method. The surface of the oxide semiconductor film 110' may be treated by oxygen plasma prior to forming the protective material film 120' if the oxide semiconductor film 110' is formed.

If a photosensitive layer is coated on the protective material film 120', the photosensitive layer may be patterned using a halftone photomask or a slit photomask. As a result, as depicted in FIG. 4A, a photosensitive layer pattern 10, which defines a region for forming the channel layer 110, may be formed. The photosensitive layer pattern 10 may have different thicknesses in different regions. A central portion of the photosensitive layer pattern 10 may be a first region that is formed to be thicker than second regions on both edge portions of the photosensitive layer pattern 10.

Figure 4B:
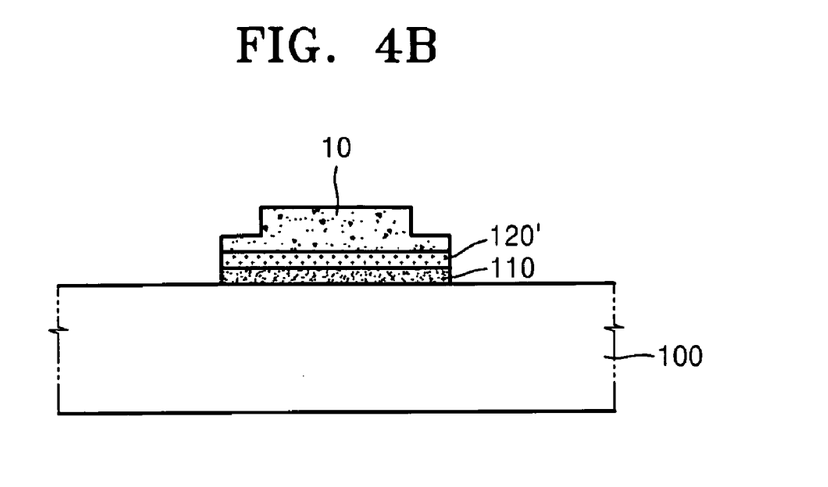

Referring to FIG. 4B, the protective material film 120' and the oxide semiconductor film 110' may be etched, e.g., sequentially etched, using the photosensitive layer pattern 10 as an etch mask. A portion of the oxide semiconductor film 110' that remains on the substrate 100 may be the channel layer 110.

Figure 4C:
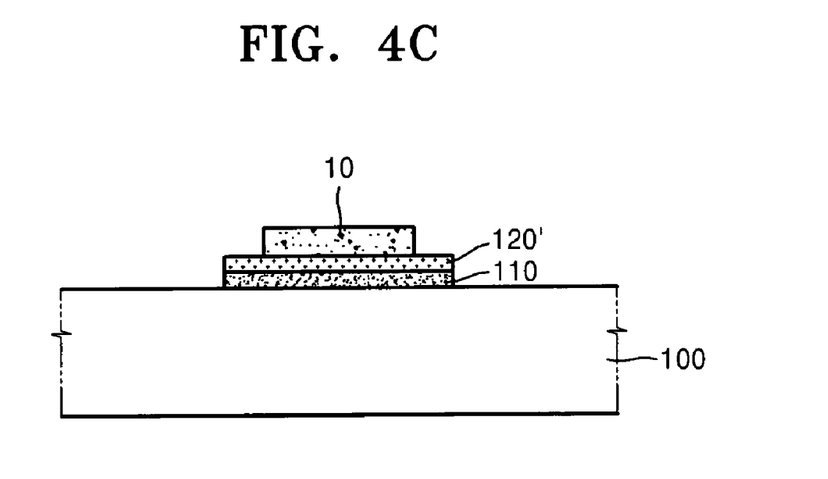

The second regions of the photosensitive layer pattern 10 may be removed by etching the photosensitive layer pattern 10 using an isotropical etching method, e.g., an oxygen ashing method. As a result, as depicted in FIG. 4C, the protective material film 120' surrounding the first region of the photosensitive layer pattern 10 may be exposed. A portion of the first region of the photosensitive layer pattern 10 may be removed while the second regions of the photosensitive layer pattern 10 are removed.

Figure 4D:
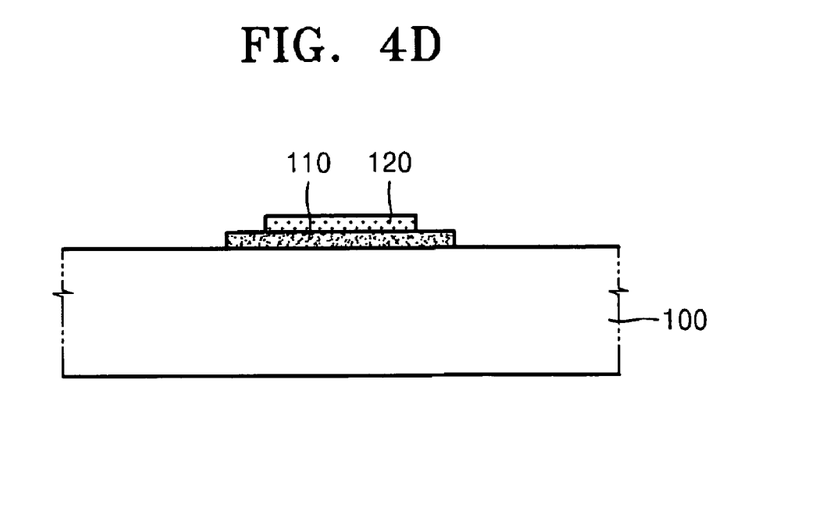

Referring to FIG. 4C, the exposed portion of the protective material film 120' may be etched using the photosensitive layer pattern 10 as an etch mask. The photosensitive layer pattern 10 may be removed. As a result, as depicted in FIG. 4D, the protective layer 120, which exposes first and second regions of the channel layer 110 facing each other on both ends of the channel layer 110, may be formed. The shape of the protective layer 120 may be determined by the photosensitive layer pattern 10 whose second regions are removed to expose the protective material film 120'. Therefore, the photosensitive layer pattern 10 of FIG. 4A may be formed by considering the shape of the protective layer 120 that is to be formed.

The protective layer 120 may expose both ends of the channel layer 110 or a central portion of both ends of the channel layer 110, however, the protective layer 120 need not extend outside the channel layer 110.

Figure 4E:
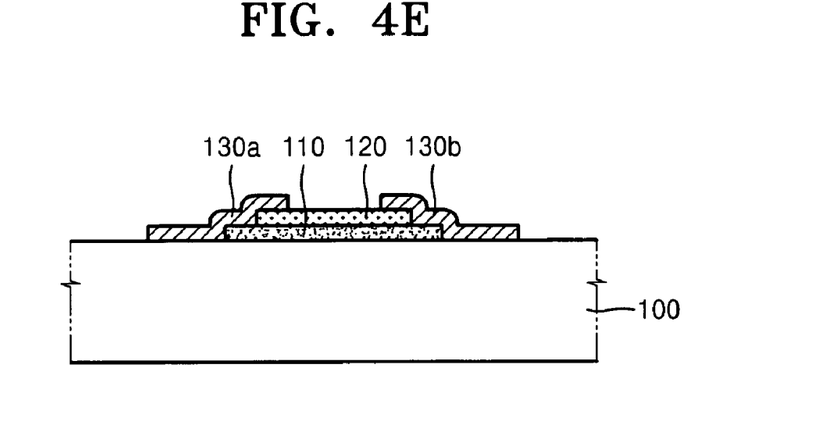

Referring to FIG. 4E, the source electrode 130*a* and the drain electrode 130*b*, which cover the exposed first and second regions, respectively, on both ends of the channel layer 110, may be formed on the substrate 100. The source electrode 130*a* and the drain electrode 130*b* may be formed using the same process described with reference to FIG. 3C. However, in the case of FIG. 4E, because lateral portions of the channel layer 110 may be exposed, a possibility that the lateral portions of the channel layer 110 may be lost in the process of forming the source electrode 130*a* and the drain electrode 130*b* may exist. However, the loss of the lateral portions of the channel layer 110 may be negligibly small. The photosensitive layer pattern 10 of FIG. 4A may be formed in consideration of the loss of the lateral portions of the channel layer 110, and therefore, the loss need not occur.

Figure 4F:
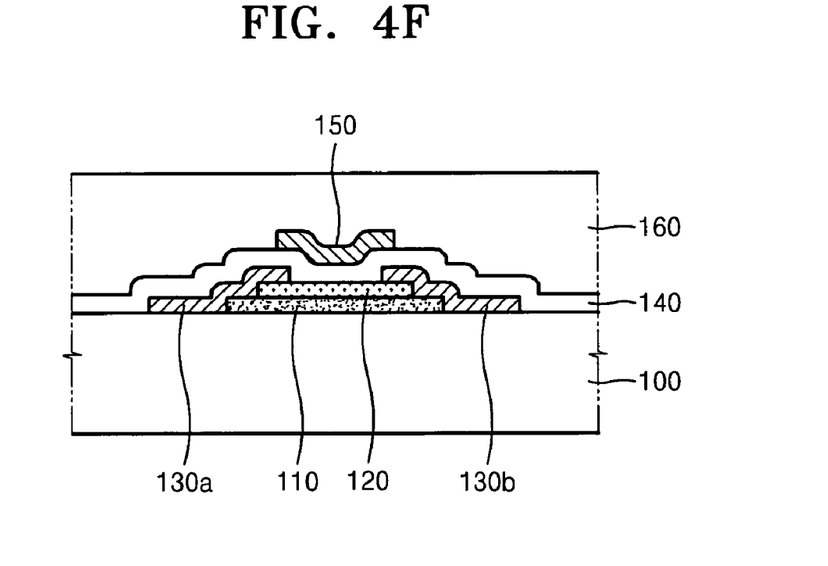

Referring to FIG. 4F, the gate insulating layer 140, the gate electrode 150, and the passivation layer 160 may be sequentially formed in the same process as described with reference to FIG. 3D.

FIGS. 5A through 5D are cross-sectional views illustrating a method of manufacturing the TFT of FIGS. 2A and 2B, according to another example embodiment.

The method of manufacturing the TFT of FIGS. 2A and 2B according to another example embodiment may be to form a TFT having a bottom gate structure. Like reference numerals are used to indicate substantially identical elements in FIGS. 2A and 2B and FIGS. 5A through 5D.

Figure 5A:
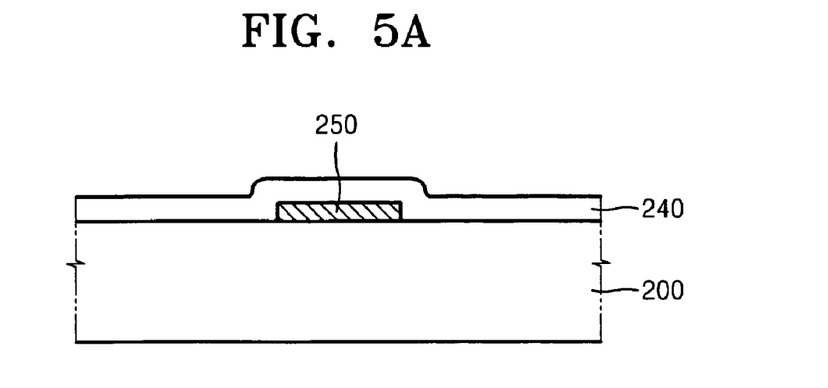
FIGS. 5A through 5D are cross-sectional views illustrating a method of manufacturing the TFT of FIGS. 2A and 2B, according to another example embodiment.

Referring to FIG. 5A, the gate electrode 250 may be formed on the substrate 200, and/or the gate insulating layer 240, which covers the gate electrode 250, may be formed on the substrate 200. After the gate insulating layer 240 is formed, a wet washing process, for removing impurities which may be present on an upper surface of the gate insulating layer 240, may be performed. In the wet washing process, a washing solution may be at least one selected from the including isopropyl alcohol (IPA), deionized water, and acetone.

Figure 5B:
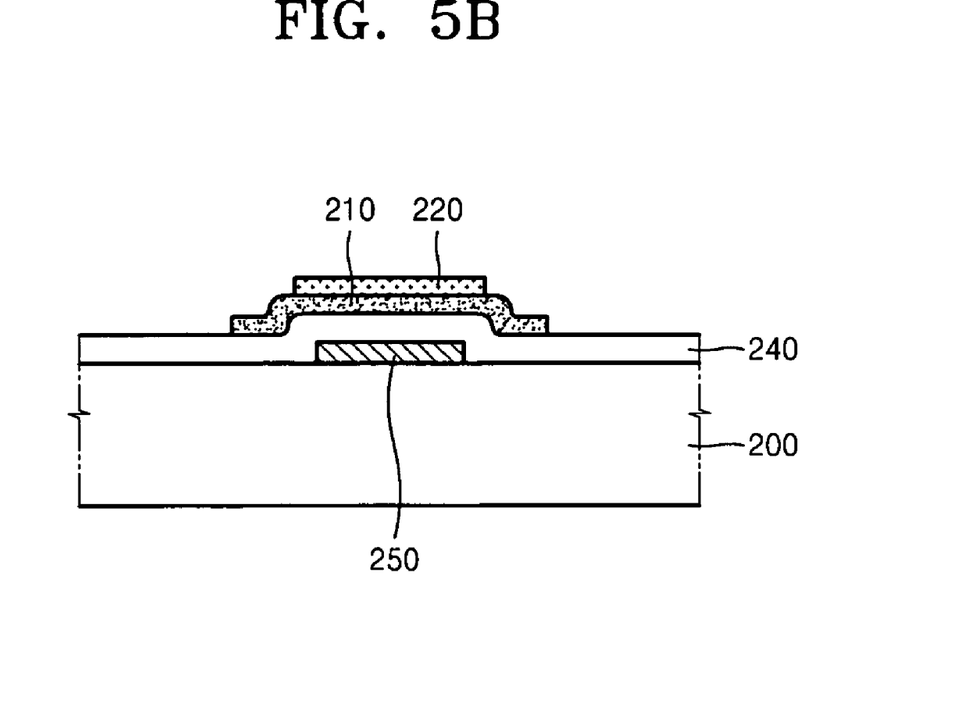

Referring to FIG. 5B, the channel layer 210 and the protective layer 220, which are sequentially stacked on the gate insulating layer 240, may be formed. The channel layer 210 may be located on the gate insulating layer 240 above the gate electrode 250. The channel layer 210 and the protective layer 220 may be formed using the methods of forming the channel layer 110 and the protective layer 120 as illustrated in FIGS. 3A through 3E and FIGS. 4A through 4F, respectively.

Figure 5C:
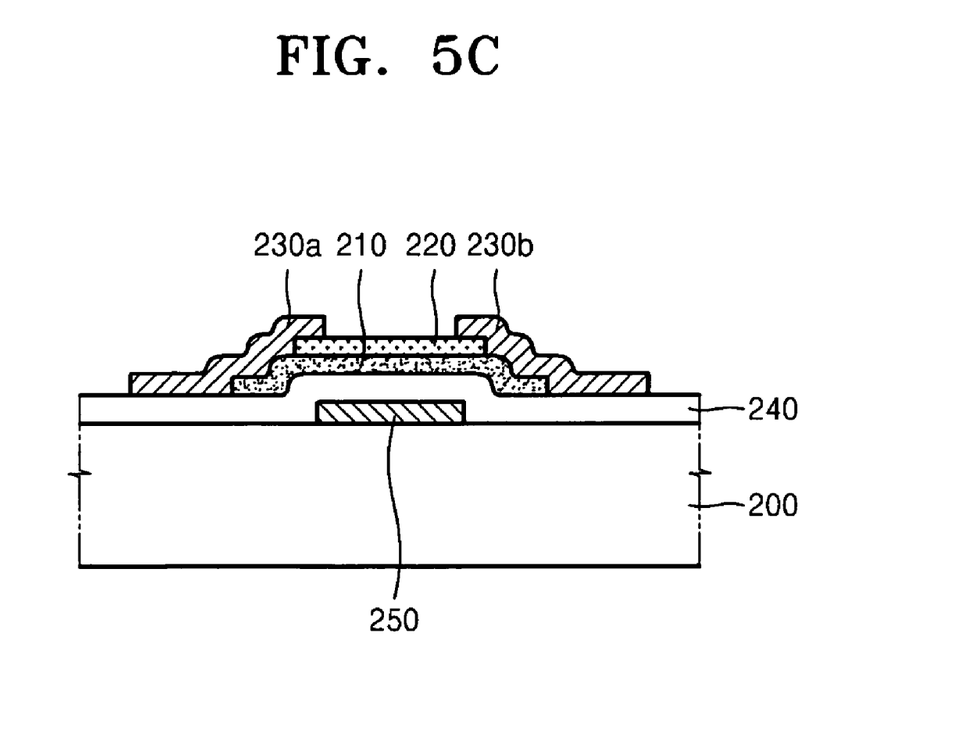

Referring to FIG. 5C, the source electrode 230*a* and the drain electrode 230*b*, which contact both ends of the channel layer 210, may be formed on the protective layer 220 and/or the gate insulating layer 240. The source electrode 230*a* and the drain electrode 230*b* may be formed using the process described with reference to FIG. 3C. An ohmic contact layer (not shown) having an oxygen content lower than an oxygen content of the channel layer 210 may be formed between the channel layer 210 and the source electrode 230*a* and between the channel layer 210 and the drain electrode 230*b* using the same process as described above.

Figure 5D:
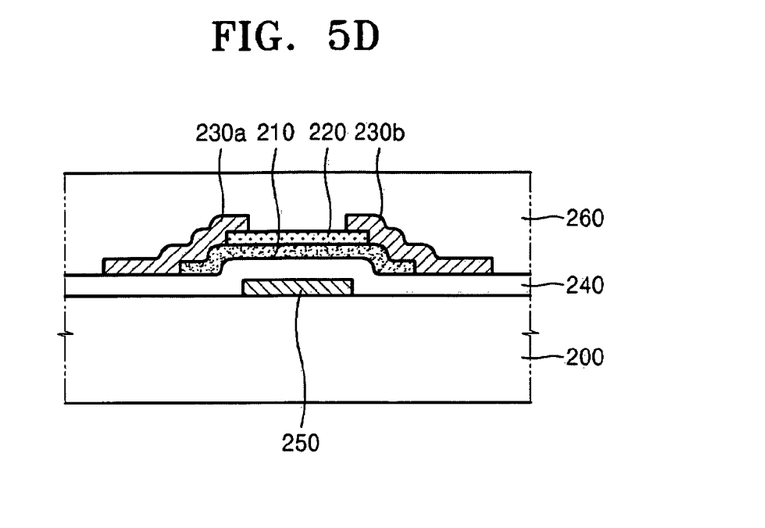

Referring to FIG. 5D, the passivation layer 260, which covers the protective layer 220, the source electrode 230*a*, and/or the drain electrode 230*b*, may be formed on the gate insulating layer 240.

Figure 6:
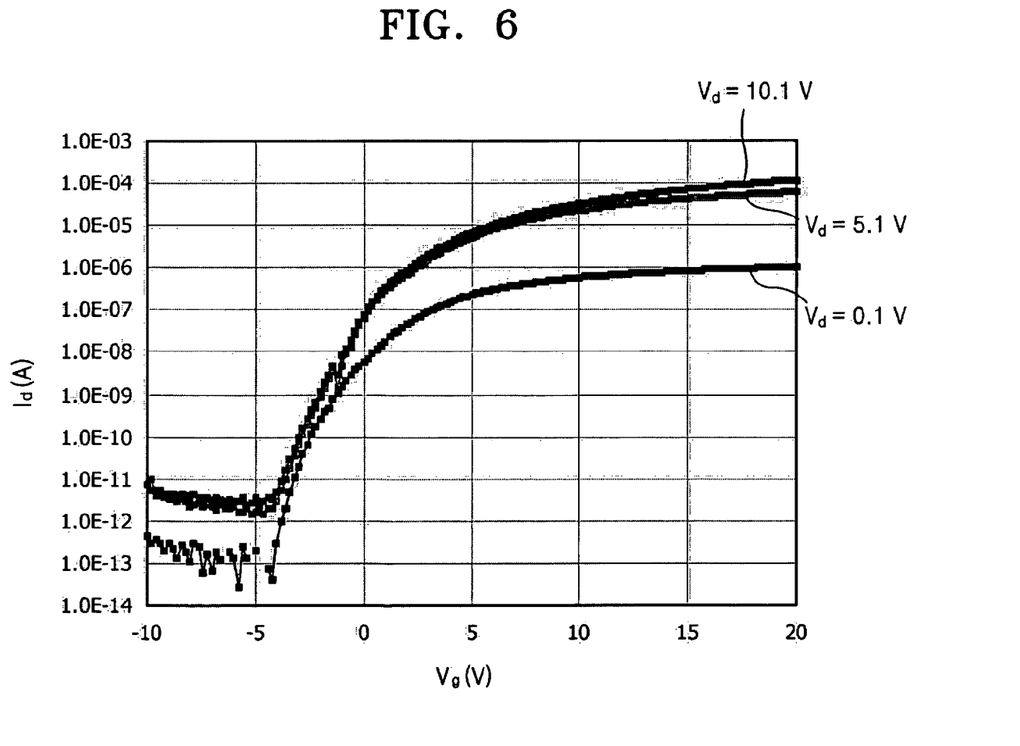
FIG. 6 is an example graph showing current vs. voltage characteristics of the TFT of FIGS. 2A and 2B, according to another example embodiment.

FIG. 6 is an example graph showing drain current $I_d$ vs. gate voltage $V_g$ characteristics in terms of drain voltages $V_d$ of the TFT of FIGS. 2A and 2B, according to another example embodiment.

Referring to FIG. 6, the TFT of FIGS. 2A and 2B according to another example embodiment may show higher switching characteristics at a higher drain voltage $V_d$ of approximately 10.1V. The result denotes that a damage to the channel layer 210 and a characteristic degradation of the channel layer 210 may be reduced during the manufacturing the TFT according to example embodiments.

As described above, a channel layer, which is formed of an oxide semiconductor material according to example embodiments, may be covered by a protective layer except for portions of the channel layer that contact the source electrode and the drain electrode, and therefore, the protective layer may protect the channel layer from being damaged or characteristically degraded in an etching process for forming the source electrode and the drain electrode. Accordingly, example embodiments may realize a TFT having a channel layer formed of an oxide semiconductor material, e.g., Ga—In—Zn—O, having higher charge mobility.

Although example embodiments have been shown and described in this specification and figures, it would be appreciated by those skilled in the art that changes may be made to the illustrated and/or described example embodiments without departing from their principles and spirit.

What is claimed is:

1. A thin film transistor, comprising:
    a channel layer including an oxide semiconductor material;
    a source electrode and a drain electrode facing each other on the channel layer;
    a protective layer under the source electrode and the drain electrode and covering the channel layer;
    a gate electrode configured to apply an electric field to the channel layer, wherein the gate electrode is above the channel layer; and
    a gate insulating layer interposed between the gate electrode and the channel layer.

2. The thin film transistor of claim 1, wherein the channel layer is a ZnO based material layer.

3. The thin film transistor of claim 2, wherein the channel layer is a $a(In_2O_3).b(Ga_2O_3).c(ZnO)$ layer, where a, b, and c are real numbers such that $a \geq 0$, $b \geq 0$, and $c > 0$.

4. The thin film transistor of claim 3, wherein the channel layer is a $a(In_2O_3).b(Ga_2O_3).c(ZnO)$ layer, where a, b, and c are real numbers such that $a \geq 1$, $b \geq 1$, and $0 < c \leq 1$.

5. The thin film transistor of claim 1, wherein
    the protective layer provides contact regions, and
    the channel layer contacts the source and drain electrodes at the contact regions.

6. The thin film transistor of claim 1, wherein the protective layer is at least one selected from a group including a silicon oxide layer and a silicon nitride layer.

7. The thin film transistor of claim 1, further comprising:
    ohmic contact layers between the channel layer and the source electrode and between the channel layer and the drain electrode.

8. A method of manufacturing a thin film transistor comprising:
    forming a channel layer including an oxide semiconductor material and a protective layer covering the channel layer;
    forming a source electrode and a drain electrode facing each other and contacting two regions of the channel layer;
    forming a gate insulating layer covering the protective layer, the source electrode, and the drain electrode; and
    forming a gate electrode on the gate insulating layer above the channel layer.

9. The method of claim 8, wherein the channel layer is a ZnO based material layer.

10. The method of claim 8, wherein
    the protective layer provides contact regions, and
    the channel layer contacts the source electrode and the drain electrode at the contact regions.

11. The method of claim 8, wherein the forming of the channel layer and the protective layer comprises:
    depositing an oxide semiconductor material film on a substrate;
    forming the channel layer by patterning the oxide semiconductor material film;
    depositing a protective material film on the substrate and the channel layer; and
    forming the protective layer by patterning the protective material film.

12. The method of claim 11, wherein
    the protective material film is patterned to a shape providing contact regions, and
    the channel layer contacts the source electrode and the drain electrode at the contact regions.

13. The method of claim 11, further comprising:
    treating the surface of the channel layer using oxygen plasma after the forming of the channel layer and before the forming of the protective material film.

14. The method of claim 11, further comprising:
    wet washing the surface of the channel layer using a washing solution after the forming of the channel layer and before the forming of the protective material film.

15. The method of claim 14, wherein the washing solution for the wet washing is at least one of a solution including isopropyl alcohol (IPA) and deionized water and a solution including acetone, IPA, and deionized water.

16. The method of claim 8, wherein the forming of the channel layer and the protective layer comprises:
    depositing an oxide semiconductor material film on a substrate;
    depositing a protective material film on the oxide semiconductor material film; and
    patterning the oxide semiconductor material film and the protective material film.

17. The method of claim 16, wherein
    the protective material film is patterned to a shape that provides contact regions, and
    the channel layer contacts the source electrode and the drain electrode at the contact regions.

18. The method of claim 16, wherein the patterning of the oxide semiconductor material film and the protective material film is performed using a halftone photomask or a slit photomask.

19. The method of claim 16, further comprising:
    treating the surface of the oxide semiconductor material film using oxygen plasma after the depositing of the oxide semiconductor material film and before the depositing of the protective material film.

20. The method of claim 16, further comprising:
    wet washing the surface of the oxide semiconductor material film using a washing solution after the depositing of the oxide semiconductor material film and before the depositing of the protective material film.

21. The method of claim 20, wherein the washing solution for the wet washing is at least one of a solution including isopropyl alcohol (IPA) and deionized water and a solution including acetone, IPA, and deionized water.

22. The method of claim 8, further comprising:
forming ohmic contact layers between the channel layer and the source electrode and between the channel layer and the drain electrode.

23. The method of claim 22, wherein the ohmic contact layers are formed of a conductive oxide having an oxygen content that is less than an oxygen content of the channel layer.

24. A method of manufacturing a thin film transistor, comprising:
forming a gate electrode;
forming a gate insulating layer covering the gate electrode;
forming a channel layer including an oxide semiconductor material on the gate insulating layer above the gate electrode and a protective layer covering the channel layer; and
forming a source electrode and a drain electrode facing each other and contacting two regions of the channel layer,
wherein the forming of the channel layer and the protective layer includes depositing an oxide semiconductor material film on the gate insulating layer, forming the channel layer by patterning the oxide semiconductor material film, treating a surface of the channel layer using oxygen plasma, depositing a protective material film on the gate insulating layer and the surface-treated channel layer, and forming the protective layer by patterning the protective material film.

25. The method of claim 24, wherein the channel layer is a ZnO based material layer.

26. The method of claim 24, wherein
the protective layer provides contact regions, and
the channel layer contacts the source electrode and the drain electrode at the contact regions.

27. The method of claim 24, wherein
the protective material film is patterned to a shape that provides contact regions, and
the channel layer contacts the source electrode and the drain electrode at the contact regions.

28. The method of claim 24, further comprising:
wet washing the surface of the channel layer using a washing solution after the forming of the channel layer and before the forming of the protective material film.

29. The method of claim 28, wherein the washing solution for the wet washing is at least one of a solution including isopropyl alcohol (IPA) and deionized water and a solution including acetone, IPA, and deionized water.

30. The method of claim 24, further comprising:
forming ohmic contact layers between the channel layer and the source electrode and between the channel layer and the drain electrode.

31. The method of claim 30, wherein the ohmic contact layers are formed of a conductive oxide having an oxygen content that is less than an oxygen content of the channel layer.

32. A method of manufacturing a thin film transistor, comprising:
forming a gate electrode;
forming a gate insulating layer covering the gate electrode;
forming a channel layer including an oxide semiconductor material on the gate insulating layer above the gate electrode and a protective layer covering the channel layer; and
forming a source electrode and a drain electrode facing each other and contacting two regions of the channel layer,
wherein the forming of the channel layer and the protective layer includes depositing an oxide semiconductor material film on the gate insulating layer, treating a surface of the oxide semiconductor material film using oxygen plasma, depositing a protective material film on the surface-treated oxide semiconductor material film, and patterning the oxide semiconductor material film and the protective material film.

33. The method of claim 32, wherein
the protective material film is patterned to a shape that provides contact regions, and
the channel layer contacts the source electrode and the drain electrode at the contact regions.

34. The method of claim 32, wherein the patterning of the oxide semiconductor material film and the protective material film is performed using a halftone photomask or a slit photomask.

35. The method of claim 32, further comprising:
wet washing the surface of the oxide semiconductor material film using a washing solution after the depositing of the oxide semiconductor material film and before the depositing of the protective material film.

36. The method of claim 35, wherein the washing solution for the wet washing is at least one of a solution including isopropyl alcohol (IPA) and deionized water and a solution including acetone, IPA, and deionized water.

* * * * *